United States Patent [19]

Hannai

[11] Patent Number: 4,833,348
[45] Date of Patent: May 23, 1989

[54] DECODER UNIT WITH CLAMP TRANSISTOR PREVENTING EXCESSIVE VOLTAGES

[75] Inventor: Seiichi Hannai, Tokyo, Japan
[73] Assignee: NEC Corporation, Tokyo, Japan
[21] Appl. No.: 184,452
[22] Filed: Apr. 21, 1988
[30] Foreign Application Priority Data Apr. 21, 1987 [JP] Japan .................................. 62-98819

[51] Int. Cl.⁴ .......................................... H03K 19/003
[52] U.S. Cl. .................... 307/449; 307/443; 307/452; 307/453; 307/463; 307/550
[58] Field of Search .............. 307/443, 448, 449, 451, 307/452, 453, 463, 481, 548, 550, 568, 577, 579, 584, 585; 365/230

[56] References Cited

U.S. PATENT DOCUMENTS

| | | | |
|---|---|---|---|
| 4,025,908 | 5/1977 | DeRemer et al. | 307/449 X |
| 4,087,044 | 5/1978 | Hofmann | 307/449 X |
| 4,275,312 | 6/1981 | Saitou et al. | 307/449 X |
| 4,381,460 | 4/1983 | Menachem | 307/463 X |
| 4,398,102 | 8/1983 | Stewart | 365/230 X |
| 4,563,598 | 1/1986 | Oritani | 307/443 X |
| 4,692,638 | 9/1987 | Stiegler | 307/578 X |
| 4,728,827 | 3/1988 | Woo | 307/452 X |
| 4,737,936 | 4/1988 | Takeuchi | 365/230 |

Primary Examiner—David Hudspeth
Attorney, Agent, or Firm—Sughrue, Mion, Zinn, Macpeak & Seas

[57] ABSTRACT

For elimination of mis-decoding operation, there is disclosed a decoder unit comprising a logic gate having input nodes respectively supplied with data bits of an input signal and carried out a logical operation to decide a logic level at an output node thereof, a precharging transistor responsive to a precharging signal and providing a conduction path between a source of positive voltage and the output node of the logic gate for charging the output node of the logic gate to a positive precharging level, an output circuit responsive to the logic level at the output node of the logic gate for producing an output signal, and a compensating transistor responsive to the voltage level at the output node of the logic gate and operative to provide a conduction path between the output node of the logic gate and the source of positive voltage, so that the compensating transistor allows an excess voltage to be discharged from the output node to the source of positive voltage, thereby preventing the decoder unit from the mis-decoding operation due to the excess voltage level at the output node of the logic gate.

9 Claims, 4 Drawing Sheets

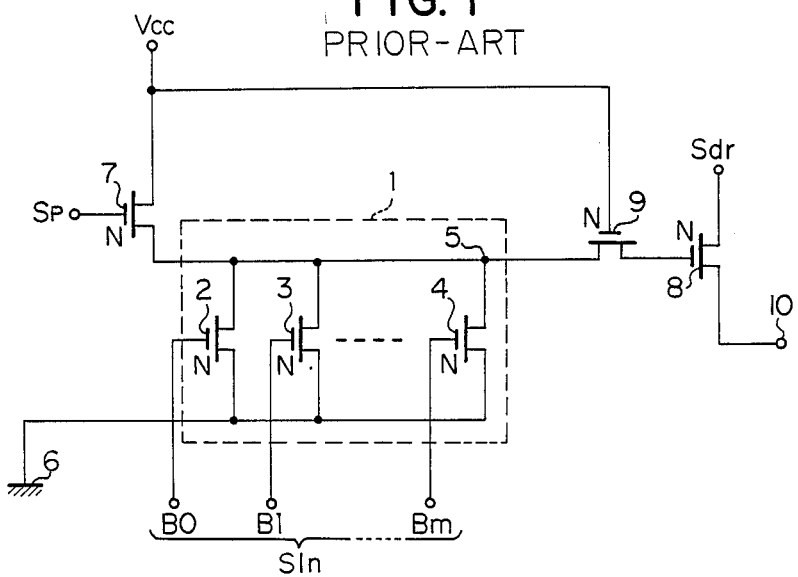
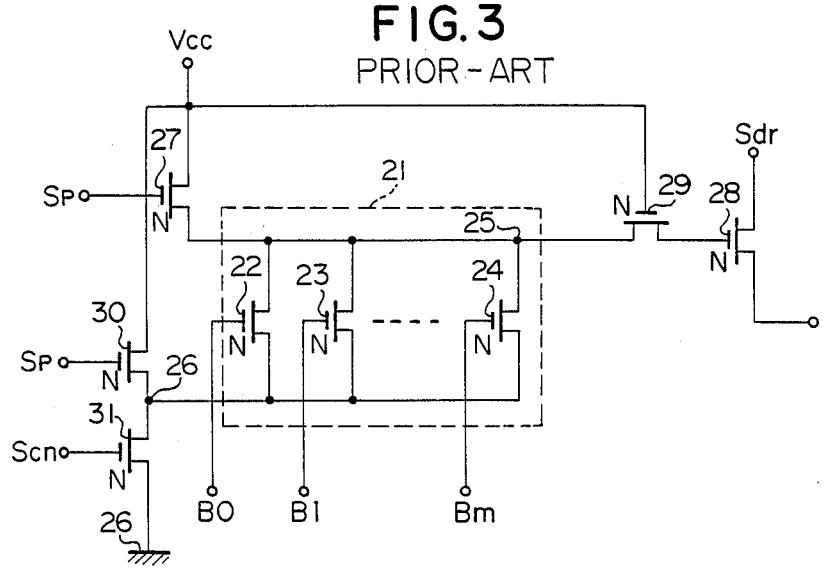

PRIOR-ART

PRIOR-ART

PRIOR-ART

DECODER UNIT WITH CLAMP TRANSISTOR PREVENTING EXCESSIVE VOLTAGES

FIELD OF THE INVENTION

This invention relates to a decoder unit and, more particularly, to a compensating transistor for keeping a precharging level in a predetermined range.

BACKGROUND OF THE INVENTION

A typical example of the decoder unit is illustrated in FIG. 1 and largely comprises a NOR gate 1 consisting of a plurality of n-channel MOS type field effect transistors 2, 3 and 4 coupled in parallel between an output node 5 and a ground node 6, a precharging transistor 7 formed by an n-channel MOS type field effect transistor coupled between a source of positive supply voltage level Vcc and the output node 5, an output transistor 8 formed by an n-channel MOS type field effect transistor with a gate electrode capable of being electrically coupled to the output node 5 of the NOR gate 1, and an n-channel MOS type field effect transistor 9 capable of transferring a voltage level at the output node 5 to the gate electrode of the output transistor 8. The precharging transistor 7 has a gate electrode where a precharging signal Sp of active high voltage level H1 appears prior to a decoding operation, so that the output node 5 is charged up to a positive high voltage level H2 lower than the positive supply voltage level Vcc by a threshold voltage Vth of the precharging transistor 7. All of the n-channel MOS type field effect transistors 2, 3 and 4 have respective gate electrodes where data bits B0 to Bm of an input signal Sin respectively appear upon the decoding operation, then the output node 5 has a voltage level of either high or low voltage level due to switching operations of the n-channel MOS type field effect transistors 2, 3 and 4. The voltage level at the output node 5 is transferred through the n-channel MOS type field effect transistor 9 to the gate electrode of the output transistor 8, and the output transistor 8 is supplied with a driving signal Sdv, so that the voltage level at a decoding node 10 reflects a result of the decoding operation carried out by the NOR gate 1.

The decoding operation of the prior-art decoder unit is hereinunder described in detail with reference to FIGS. 2A and 2B. Prior to the decoding operation, the precharging signal Sp is in the active high voltage level H1 so as to allow the precharging transistor 7 to turn on, thereby charging up the output node 5 to the positive high voltage level H2. After the precharging operation for the output node 5, the precharging signal Sp goes down to the ground level at time t1. Assuming now that at least one data bit B0 of the input signal Sin is in a positive high voltage level H3 corresponding to logic "1" level as seen in FIG. 2A, one of the n-channel MOS type field effect transistors 2 to 4 turns on to provide a conduction path between the output node 5 and the ground node 6, so that the output node 5 is discharged to the ground level at time t2. The output node 5 of the ground level causes the output transistor 8 to remain in the off state, so that the decoding node 10 keeps the ground level even if the driving signal Sdv goes up to the positive high voltage level at time t3. The precharing signal Sp goes up to the positive high voltage level again for the subsequent decoding operation at time t5.

On the other hand, if the input signal Sin consists of the data bits of the ground levels as shown in FIG. 2B, the output node 5 remains in the positive high voltage level H2 upon application of the input signal Sin. The positive high voltage level at the output node 5 is transferred to the gate electrode of the output transistor 8 through the n-channel MOS type field effect transistor 9 applied with the positive supply voltage level Vcc, and, for this reason, the output transistor 8 turns on to provide a conduction path to the decoding node 10. At time t3, the driving signal Sdv goes up to the positive high voltage level, then the decoding node 10 follows the driving signal Sdv with a delay and reaches the positive high voltage level at time t4. The precharging signal Sp goes up to the positive high voltage level at time t5 as similar to the above mentioned decoding operation. Thus, the prior-art decoding unit carries out the decoding operation on the input signal Sin.

However, a problem is encountered in the prior-art decoding unit in mis-decoding operation due to unusual voltage level at the output node 5. In detail, if the output node 5 goes up to an extremely high voltage level Hhh larger than the sum of the supply voltage level Vcc and the threshold voltage level Vth due to, for example, an electrostatic induction as shown in FIG. 2C, the decoding node 10 tends to remain in a positive voltage level H4 larger than a threshold voltage of a component transistor even if one of the data bit B0 is in the positive high voltage level H3. If one of the data bit is in the positive high voltage level H3, the decoding node 10 should remain in the ground level as shown in FIG. 2A. This means that a mis-decoding operation takes place in the decoding unit. If the decoding unit is incorporated in an address decoder of a memory device together with other decoder units, the mis-decoding operation causes the address decoder to specify a plurality of addresses or produce a multi-selection. The multi-selection is liable to take place in the address decoder upon application of the input signal Sin with only one logic "1" bit.

Another prior art decoder unit is illustrated in FIG. 3 and largely comprises a NOR gate 21 consisting of a plurality of n-channel MOS type field effect transistors 22, 23 and 24 coupled in parallel between an output node 25 and a reference node 26, a precharging transistor 27 formed by an n-channel MOS type field effect transistor coupled between a source of positive supply voltage level Vcc and the output node 25, an output transistor 28 formed by an n-channel MOS type field effect transistor with a gate electrode capable of being electrically coupled to the output node 25 of the NOR gate 21, an n-channel MOS type field effect transistor 29 capable of transferring a voltage level at the output node 25 to the gate electrode of the output transistor 28, and a series combination of n-channel MOS type field effect transistors 30 and 31 coupled between the source of positive supply voltage level Vcc and the ground node 26. The decoder unit illustrated in FIG. 3 is basically similar in circuit behavior to that in FIG. 1 except for the function of the series combination of the n-channel MOS type field effect transistors 30 and 31. The reference node 26 is provided between the n-channel MOS type field effect transistors 30 and 31, so that the NOR gate 21 is activated with a control signal Scn applied to a gate electrode of the n-channel MOS type field effect transistor 31. However, the output node 25 is merely coupled to the source of positive supply voltage level Vcc, then the same problem is encountered in the prior-art decoder unit illustrated in FIG. 3.

SUMMARY OF THE INVENTION

It is therefore an important object of the present invention to provide a decoder unit which is free from the problem inherent in the prior-art decoder units.

To accomplish these objects, the present invention proposes to provide a compensating transistor for discharging the undesirable excess voltage.

In accordance with the present invention, there is provided a decoder unit operative to decode an input signal having a plurality of data bits, comprising: (a) a logic gate having input nodes respectively supplied with the data bits and carried out a logical operation to decide a logic level at an output node thereof, the logic level having a first voltage level or a second voltage level; (b) a precharging transistor responsive to a precharging signal and providing a conduction path between a source of voltage and the output node of the logic gate for charging the output node of the logic gate to the first voltage level; (c) an output circuit responsive to the logic level at the output node of the logic gate for producing an output signal depending upon the logic level at the output node of the logic gate; and (d) a compensating transistor responsive to the voltage level at the output node of the logic gate and operative to provide a conduction path between the output node of the logic gate and the source of voltage when the output node of the logic gate has an excess voltage level which is out of a range between the first voltage level and the second voltage level.

The compensating transistor may be formed by an n-channel type field effect transistor coupled between the output node of the logic gate and a source of positive voltage and having a gate electrode coupled to the output node of the logic gate, however the compensating transistor can be formed by a p-channel type field effect transistor coupled between the output node of the logic gate and the source of positive voltage and having a gate electrode coupled to the source of positive voltage. The decoder unit may be of the type having an activation circuit for the logic gate. The decoder unit may be incorporated in an address decoder for elimination of multiselection.

BRIEF DESCRIPTION OF THE DRAWINGS

The features and advantages of a decoder unit according to the present invention will be more clearly understood from the following description taken in conjunction with the accompanying drawings in which:

FIG. 1 is a circuit diagram showing the arrangement of a prior art decoder unit;

FIG. 3 is a circuit diagram showing the arrangement of another prior art decoder unit;

DESCRIPTION OF THE PREFERRED EMBODIMENTS

First Embodiment

Figure 2A:
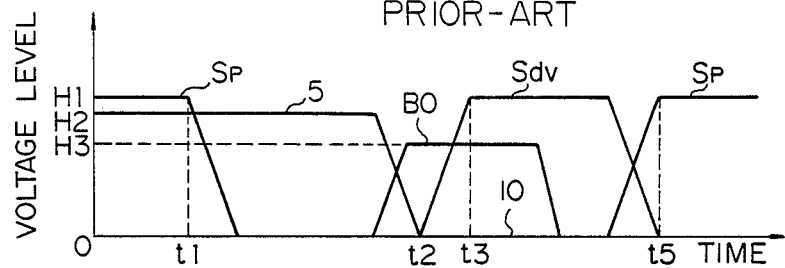
FIGS. 2A to 2C are graphs each showing the waveforms of essential signals appearing in the decoder unit illustrated in FIG. 1 in various conditions.
Figure 2B:
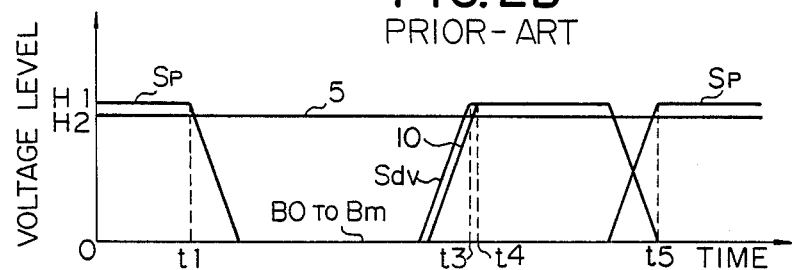
Figure 2C:
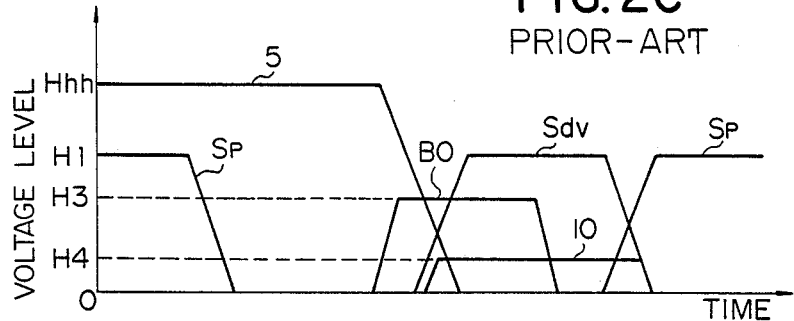
Figure 4:
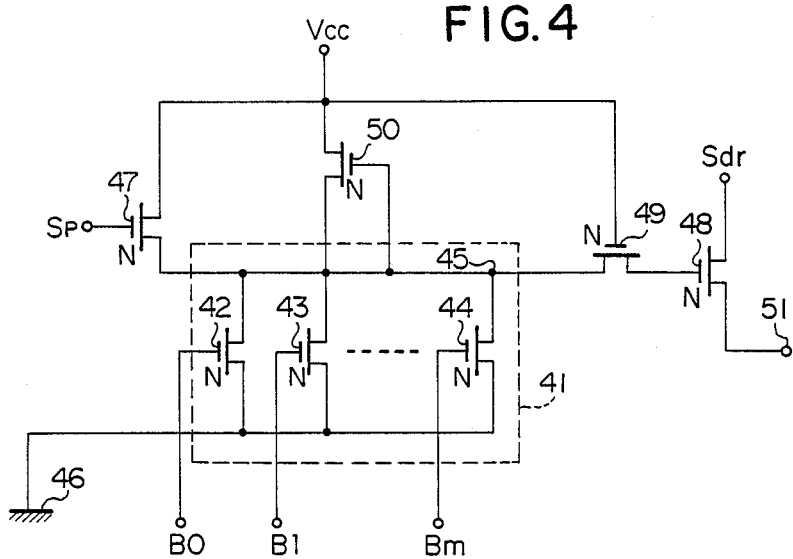
FIG. 4 is a circuit diagram showing the arrangement of a decoder unit embodying the present invention.

Referring to FIG. 4 of the drawings, there is shown the circuit arrangement of a decoder unit of the present invention which largely comprises a NOR gate 41 having a plurality of n-channel MOS type field effect transistors including transistors 42, 43 and 44 coupled in parallel between an output node 45 and a ground node 46, a precharging transistor 47 formed by an n-channel MOS type field effect transistor coupled between a source of positive supply voltage level Vcc and the output node 45, an output transistor 48 formed by an n-channel MOS type field effect transistor with a gate electrode capable of being electrically coupled to the output node 45 of the NOR gate 41, an intermediate transistor 49 formed by an n-channel MOS type field effect transistor capable of providing a conduction path between the output node 45 and the gate electrode of the output transistor 48, and a compensating transistor 50 formed by an n-channel MOS type field effect transistor coupled between the source of positive supply voltage level Vcc and the output node 45 of the NOR gate 41.

The precharging transistor 47 has a gate electrode where a precharging signal Sp of active high voltage level H1 appears prior to a decoding operation, and the output node 45 is charged up to a positive high voltage level H2 lower than the positive supply voltage level Vcc by a threshold voltage Vth of the precharging transistor 47. All of the n-channel MOS type field effect transistors including the transistors 42, 43 and 44 have respective gate electrodes where data bits B0 to Bm of an input signal Sin respectively appear upon the decoding operation, then the output node 45 has a voltge level of either high or low voltage level due to switching operations of the n-channel MOS type field effect transistors of the NOR gate 41. The voltage level at the output node 45 is transferred through the intermediate transistor 49 to the gate electrode of the output transistor 48, and the output transistor 48 is supplied with a driving signal Sdv for detection of the NOR operation, so that the voltage level at a decoding node 51 reflects a result of the decoding operation carried out by the NOR gate 41.

The compensating transistor 50 has a gate electrode coupled to the output node 45 of the NOR gate 41, so that the compensating transistor 50 turns on to provide a conduction path between the source of positive supply voltage Vcc and the output node 45 of the NOR gate 41 if the voltage level at the output node 45 excesses the sum of the positive supply voltage level Vcc and the threshold voltage Vth of the compensating transistor 50. Thus, the decoder unit illustrated in FIG. 4 does not allow the output node 45 to have an extremely high voltage level which results in mis-decoding operation as described hereinbefore. The decoder unit illustrated in FIG. 4 is similar in usual operation to the decoder unit shown in FIG. 1, so that no further description for the operation is incorporated.

Second Embodiment

Figure 5:
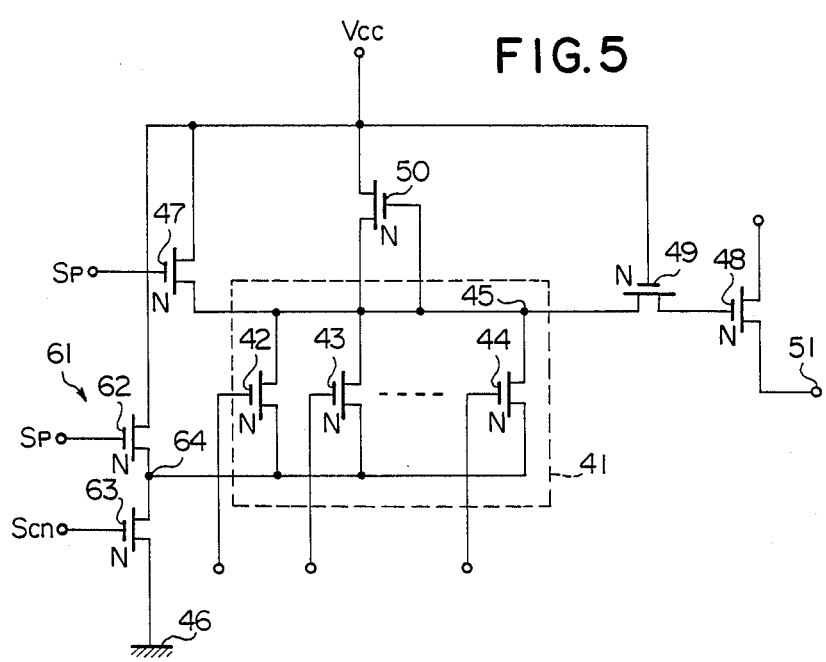
FIG. 5 is a circuit diagram showing the arrangement of another decoder unit embodying the present invention.

Turning to FIG. 5 of the drawings, the circuit arrangement of another decoder unit according to the present invention is illustrated. The decoder unit illustrated in FIG. 5 is similar in circuit arrangement to the decoder unit shown in FIG. 4 except for an activation circuit 61, so that transistors are denoted by like reference numerals designating the corresponding component transistors of the decoder unit shown in FIG. 4. The activation circuit 61 comprises a series of n-channel MOS type field effect transistors 62 and 63 coupled between the source of positive supply voltage Vcc and the ground node 46, and all of the n-channel MOS type field effect transistors including the transistors 42 to 44 are coupled at one ends thereof to a reference node 64 provided between the n-channel MOS type field effect transistors 62 and 63. The n-channel MOS type field effect transistor 62 has a gate electrode supplied with the precharging signal Sp, and the n-channel MOS type field effect transistor 63 has a gate electrode supplied with a control signal Scn of active high voltage level. The activation circuit 61 thus arranged prohibits the NOR gate 41 from the logical operation before application of the control signal Scn. In detail, when the precharging signal Sp is applied to the gate electrodes of the n-channel MOS type field effect transistors 47 and 62, the output node 45 is approximately equal in voltage level to the reference node 64, so that all of the n-channel MOS type field effect transistors of the NOR gate 41 remain in the respective off states even if the input signal Sin is applied to the NOR gate 41. Subsequently, if the control signal Scn is applied to the gate electrode of the n-channel MOS type field effect transistor 63, the reference node 64 is electrically connected to the ground node 46, then the NOR gate 41 begins the logical operation on the input signal Sin.

Third Embodiment

Figure 6:
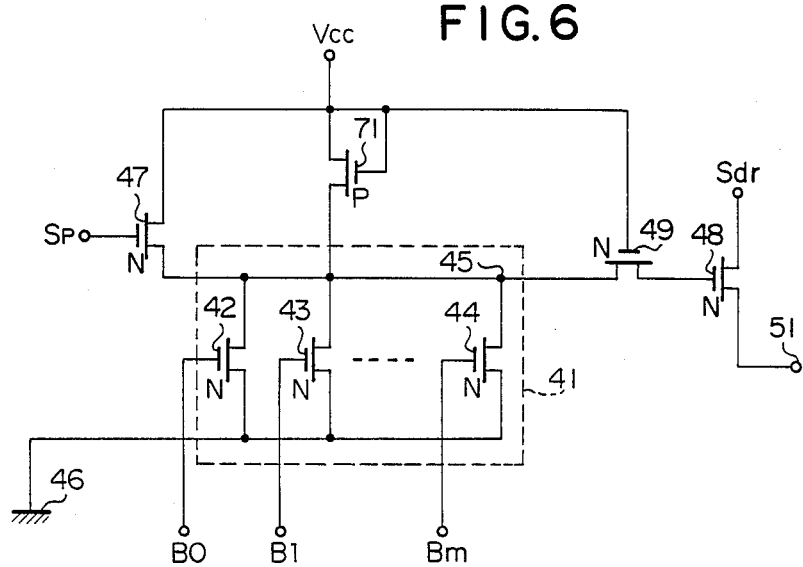
FIG. 6 is a circuit diagram showing the arrangement of still another decoder unit embodying the present invention.

Turning to FIG. 6, there is shown still another decoder circuit of the present invention which is similar in circuit arrangement to the decoder circuit illustrated in FIG. 4 except for a compensating transistor 71, so that component transistors are denoted by like reference numerals designating the corresponding transistors of the decoder unit illustrated in FIG. 4 but detailed description will be omitted for the sake of simplicity. In this instance, the compensating transistor 71 is formed by a p-channel MOS type field effect transistor coupled between the source of positive supply voltage Vcc and the output node 45 of the NOR gate 41, and the p-channel MOS type field effect transistor has a gate electrode coupled to the source of positive supply voltage level Vcc. Then, if the output node 45 excesses the sum of the supply voltage level Vcc and the threshold voltage Vth of the compensating transistor 71, the compensating transistor 71 turns on to provide a conduction path from the output node 45 to the source of positive supply voltage level Vcc, thereby discharging the excess voltage to the source of positive supply voltage level Vcc.

As will be understood from the foregoing description, the decoder units according to the present invention are advantageous in stable operation over the prior-art decoder units, because the output nodes 45 can not have an undesirable excess voltage level by virtue of the compensating transistors.

Although particular embodiment of the present invention have been shown and described, it will be obvious to those skilled in the art that various changes and modifications may be made without departing from the spirit and scope of the present invention.

What is claimed is:

1. A decoder unit operative to decode an input signal having a plurality of data bits, comprising:
   (a) a logic gate having input nodes respectively supplied with said data bits and carrying out a logical operation to decide a logic level at an output node thereof, said logic level having a first voltage level or a second voltage level;
   (b) a precharging transistor responsive to a precharging signal and providing a conduction path between a source of voltage and the output node of said logic gate for charging the output node of said logic gate to said first voltage level;
   (c) an output circuit responsive to the logic level at the output node of said logic gate for producing an output signal depending upon said logic level at the output node of said logic gate; and
   (d) a compensating transistor responsive to the voltage level at the output node of said logicl gate and operative to provide a conduction path between the output node of said logic gate and said source of voltage when the output node of said logic gate has an excess voltage level which is out of a range between said first voltage level and said second voltage level.

2. A decoder unit as set forth in claim 1, in which said logic gate carries out a NOR operation.

3. A decoder unit as set forth in claim 2, in which said logic gate comprises a plurality of n-channel type field effect transistors coupled in parallel between said output node and a ground node and in which said n-channel type field effect transistors have respective gate electrodes supplied with said data bits, respectively.

4. A decoder unit as set forth in claim 3, in which said precharing transistor is formed by an n-channel type field effect transistor coupled between a source of positive voltage and the output node of said logic gate and having a gate electrode where a precharging signal of an active high voltage level appears.

5. A decoder unit as set forth in claim 4, in which said output circuit comprises an n-channel type output transistor shifted between an on state and an off state on the basis of a voltage level at a gate electrode thereof for transferring and blocking a driving signal serving as said output signal, and an n-channel type intermediate transistor coupled between the output node of said logic gate and the gate electrode of said output transistor and having a gate electrode coupled to said source of positive voltage.

6. A decoder unit as set forth in claim 5, in which said compensating transistor is formed by an n-channel type field effect transistor coupled between the output node of said logic gate and said source of positive voltage and having a gate electrode coupled to the output node of said logic gate.

7. A decoder unit as set forth in claim 5, in which said compensating transistor is formed by a p-channel type field effect transistor coupled between the output node of said logic gate and said source of positive voltage and having a gate electrode coupled to the source of positive voltage.

8. A decoder unit as set forth in claim 1, in which said decoder unit further comprises an activation circuit responsive to a control signal for allowing said logic gate to carry out the logical operation.

9. A decoder unit as set forth in claim 8, in which said activation circuit comprises a series combination of n-channel type field effect transistors coupled between said source of voltage and a ground node and in which said logic gate comprises a plurality of n-channel type field effect transistors coupled in parallel between said output node thereof and a reference node provided between two of the n-channel type field effect transistors of said activation circuit.

* * * * *